United States Patent
Lee et al.

(10) Patent No.: US 8,359,175 B2
(45) Date of Patent: *Jan. 22, 2013

(54) APPARATUS AND METHOD FOR CHECKING INSULATION OF CELL MODULE ASSEMBLY AND PROBE FOR IT

(75) Inventors: Ju-Seok Lee, Chungbuk (KR); John E. NamGoong, Chungbuk (KR)

(73) Assignee: LG Chem, Ltd., Seoul (KR)

( * ) Notice: Subject to any disclaimer, the term of this patent is extended or adjusted under 35 U.S.C. 154(b) by 249 days.

This patent is subject to a terminal disclaimer.

(21) Appl. No.: 12/667,124

(22) PCT Filed: Oct. 12, 2009

(86) PCT No.: PCT/KR2009/005815
§ 371 (c)(1),
(2), (4) Date: Dec. 29, 2009

(87) PCT Pub. No.: WO2010/044571
PCT Pub. Date: Apr. 22, 2010

(65) Prior Publication Data
US 2011/0191043 A1      Aug. 4, 2011

(30) Foreign Application Priority Data
Oct. 13, 2008   (KR) .................. 10-2008-0100279

(51) Int. Cl.
*G01R 31/36*      (2006.01)

(52) U.S. Cl. .................. 702/63; 702/34; 702/35
(58) Field of Classification Search ........ 702/63–65; 324/426, 551, 557, 559, 724; 429/50, 90
See application file for complete search history.

(56) References Cited

U.S. PATENT DOCUMENTS

| | | | |
|---|---|---|---|
| 2006/0186890 A1* | 8/2006 | Iwane et al. ............. | 324/426 |
| 2009/0108850 A1* | 4/2009 | Yamagami et al. ....... | 324/551 |
| 2011/0115490 A1* | 5/2011 | Klijn ....................... | 324/430 |
| 2012/0019256 A1* | 1/2012 | Lee et al. ................. | 324/437 |

FOREIGN PATENT DOCUMENTS

| | | |
|---|---|---|
| JP | 11-176465 A | 7/1999 |
| JP | 2008-191064 A | 8/2008 |
| KR | 10-0601519 B1 | 7/2006 |

* cited by examiner

*Primary Examiner* — Sujoy Kundu
(74) *Attorney, Agent, or Firm* — Birch, Stewart, Kolasch & Birch, LLP

(57) ABSTRACT

An apparatus for checking insulation of a cell module assembly composed of a plurality of pouch cells includes a first probing unit electrically contacted to an electrode of the cell module assembly; a second probing unit electrically contacted to aluminum films of selected ones of the pouch cells in the cell module assembly; and a measuring unit for measuring an insulation resistance between the first probing unit and the second probing unit. This apparatus may measure insulation resistances of a plurality of pouch cells of the cell module assembly at once, thereby ensuring faster insulation checking.

22 Claims, 7 Drawing Sheets

APPARATUS AND METHOD FOR CHECKING INSULATION OF CELL MODULE ASSEMBLY AND PROBE FOR IT

CROSS-REFERENCE TO RELATED APPLICATIONS

The present application is a National Stage of PCT/KR2009/005815, filed Oct. 12, 2009. This application also claims priority under 35 U.S.C. §119(a) to Korean Patent Application No. 10-2008-0100279 filed in the Republic of Korea on Oct. 13, 2008, the entire contents of which are incorporated herein by reference.

BACKGROUND OF THE INVENTION

1. Field of the Invention

The present invention relates to apparatus and method for checking insulation of a cell module assembly composed of a plurality of pouch cells and a probe for the same. More particularly, the present invention relates to apparatus and method for rapidly checking and determining insulation of the entire cell module assembly by means of a probing means such as a probe electrically contactable with all of the plurality of pouch cells, and a probe for the same.

2. Description of the Related Art

A cell module assembly is an assembly composed of a plurality of pouch cells. The pouch cell has a battery cell therein, and a polymer wrapping corresponding to a pouch is provided to surround the battery cell.

Referring to FIG. 1 that is a perspective view showing an appearance of a pouch cell and FIG. 2 that is a sectional view taken along the line A-A', a pouch cell 100 includes electrodes 110, a pouch 120 and a battery cell 130.

To make such a pouch cell 100, as shown in FIG. 3, a pouch material having a predetermined size capable of wrapping the battery cell 130 is adhered to upper and lower portions of the battery cell 130.

The pouch 120 protects the battery cell 130 and is configured as an aluminum film so as to complement electric chemical properties of the battery cell 130 and improve thermal resistance thereof. Also, in order to ensure insulation of the battery cell 130 from the outside, the aluminum film is coated with an insulating material such as PET (polyethylene terephthalate) resin or nylon resin.

In case upper and lower pouches are bonded to configure the pouch as shown in FIG. 3, CPP (casted polypropylene) or PP (polypropylene) may be used for adhesion between the upper and lower pouches. In this case, as shown in FIG. 4, the sealing surface serving as an outer periphery used for adhesion of the pouch 120 has insulating layers 121, aluminum films 123 and an adhesive layer 125.

In case the inner structure of the pouch cell 100 is broken or damaged due to an external impact to destroy insulation of the pouch cell 100, the battery cell cannot maintain a normal voltage but may cause low voltage, which may result in swelling of the inner battery cell.

This may cause consecutive problems such as explosion of the battery cell, which is fatal to a user or mounted equipment, so it is preferred to thoroughly check the insulation of the pouch cell 100 and thus fundamentally eliminate inferiority.

FIG. 5 shows a cell module assembly 200 composed of a plurality of pouch cells configured as above, and the cell module assembly 200 is a battery module in which a plurality of pouch cells 100 as above are connected in series. A portion of the pouch cell 100 corresponding to the electrode 110 (see FIG. 1) is electrically contacted to an electrode 210 provided at the cell module assembly 200, and the pouch 120 of each pouch cell 100 is partially exposed out.

FIG. 6 illustrates an apparatus for checking an insulation resistance of the cell module assembly, which is generally used conventionally. As shown in FIG. 6, one probing unit 310 is electrically contacted to the electrode 210, and another probing unit 320 is electrically contacted to the aluminum film 123 of the pouch, exposed out. After that, electric characteristic values of both probing units 310, 320 are measured.

In the above method, a probing unit should be contacted to the aluminum film 123 so as to measure insulation. However, the probing unit 320 is point-contacted with the aluminum film 123, which cannot ensure reliable contact. In addition, if a force is applied for better physical contact between the probing unit 320 and the aluminum film 123, the outer periphery of the pouch may be easily deformed without enduring the applied force due to its material properties, so it is not easy to maintain the physical contact for electric connection between the probing unit 320 and the aluminum film 123, which makes it difficult to perform the checking work.

In addition, the cell module assembly is generally composed of a plurality of cells, and the plurality of cells should be measured one by one so as to determine insulation of the cell module assembly itself, which consumes a lot of time as much as the number of cells.

As a result, the insulation test for the pouch cell does not ensure reliability due to the above general conditions, and a lot of time is consumed for the checking work. Thus, it is difficult to remove inferior cells or inferior cell module assemblies, and the appearance of the pouch may be easily broken. In addition, the above method may be an obstacle in automating the insulation checking work due to the above problems.

SUMMARY OF THE INVENTION

The present invention is designed to solve the problems of the prior art, and therefore it is an object of the present invention to provide apparatus and method for effectively measuring and checking insulation of a cell module assembly by using a probing unit that may be electrically contacted to all pouches of a plurality of cells included in the cell module assembly, and a probe for the same.

Other objects and advantages will be explained below and easily understood from the following embodiments. Also, the objects and advantages of the present invention may be realized by components defined in the claims and their combinations.

In order to accomplish the above object, the present invention provides an apparatus for checking insulation of a cell module assembly composed of a plurality of pouch cells, the apparatus including a first probing means electrically contacted to an electrode of the cell module assembly; a second probing means electrically contacted to aluminum films of selected ones of the pouch cells in the cell module assembly; and a measuring means for measuring an insulation resistance between the first probing means and the second probing means.

Preferably, the apparatus may further include a determining means for determining insulation of the pouch cells by comparing the measured insulation resistance with a reference value.

Also, the second probing means may have at least one groove, and the aluminum films of the plurality of selected pouch cells may be contacted to the groove. At this time, the groove may include a guide for guiding a sliding movement; and a sliding unit laterally movable along the guide. In addition, the second probing means is preferably made of conductive elastic material, and the conductive elastic material is preferably a conductive silicon rubber.

Along with it, the reference value may be set identically to a reference value for determining insulation of a single pouch cell, and, in case reference values for determining insulation of the plurality of selected pouch cells are not identical to each other, the reference value may be set as a smallest value of the reference values.

In another aspect of the present invention, there is also provided a method for checking insulation of a cell module assembly composed of a plurality of pouch cells, the method including a first contacting step for electrically contacting a first probing means to an electrode of the cell module assembly; a second contacting step for electrically contacting a second probing means to aluminum films of selected ones of the pouch cells in the cell module assembly; and a measuring step for measuring an insulation resistance between the first probing means and the second probing means.

In still another aspect of the present invention, there is also provided a probe for checking insulation of a cell module assembly by measuring an insulation resistance between an electrode of a cell module assembly composed of a plurality of pouch cells and aluminum films of selected ones of the plurality of pouch cells, wherein the probe has a contact portion electrically contacted to all aluminum films of the plurality of selected pouch cells.

The apparatus and method for checking insulation of a cell module assembly and the probe for the same allow rapid measurement and check of insulation of the cell module assembly.

Also, since the insulation of the cell module assembly itself is checked prior to checking individual battery cells, the insulation checking for individual battery cells may be excluded depending on the checking result of the proceeding cell module assembly checking, so the present invention may give the same result without performing an insulation checking for every battery cells, which may remarkably reduce time and costs for the checking work.

Along with it, the material and structure of the probe contacted with a plurality of cells are improved as suggested in the present invention to ensure reliable electric contact, thereby providing a more reliable insulation checking method.

BRIEF DESCRIPTION OF THE DRAWINGS

Other objects and aspects of the present invention will become apparent from the following description of embodiments with reference to the accompanying drawing in which.

DESCRIPTION OF THE PREFERRED EMBODIMENT

Hereinafter, preferred embodiments of the present invention will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present invention on the basis of the principle that the inventor is allowed to define terms appropriately for the best explanation.

Therefore, the description proposed herein is just a preferable example for the purpose of illustrations only, not intended to limit the scope of the invention, so it should be understood that other equivalents and modifications could be made thereto without departing from the spirit and scope of the invention.

Hereinafter, apparatus and method for checking insulation, namely an insulation resistance, of a cell module assembly 200 according to the present invention and a probe for the same will be explained in detail with reference to the accompanying drawings.

The insulation checking apparatus of the present invention checks insulation of the cell module assembly 200 composed of a plurality of pouch cells 100. Here, a first probing unit 310 is electrically contacted to an electrode 210 of the cell module assembly 200 as shown in FIG. 8.

Figure 12:
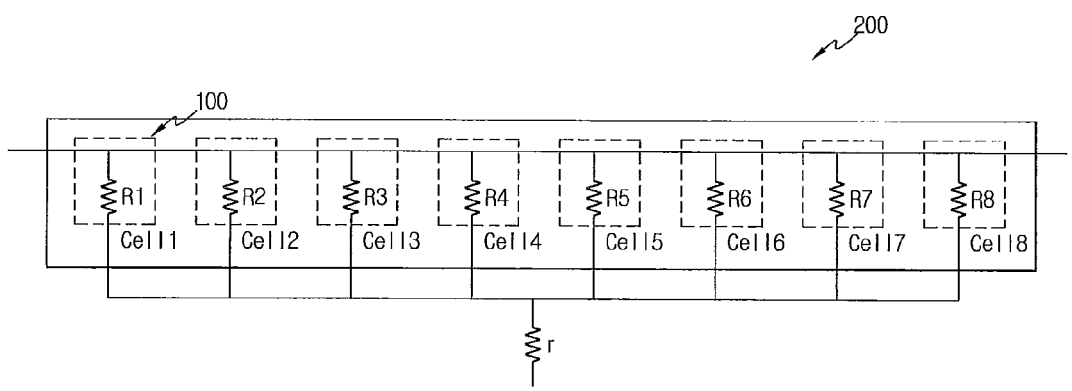
FIG. 12 is a circuit diagram showing an equivalent circuit of an insulation resistance of a cell module assembly according to the present invention.

The plurality of pouch cells 100 are connected to the cell module assembly 200 in series as shown in the equivalent circuit of FIG. 12, so electrodes of cells provided at an end of the cell module assembly may be considered as electrodes of the cell module assembly 200.

Figure 8:
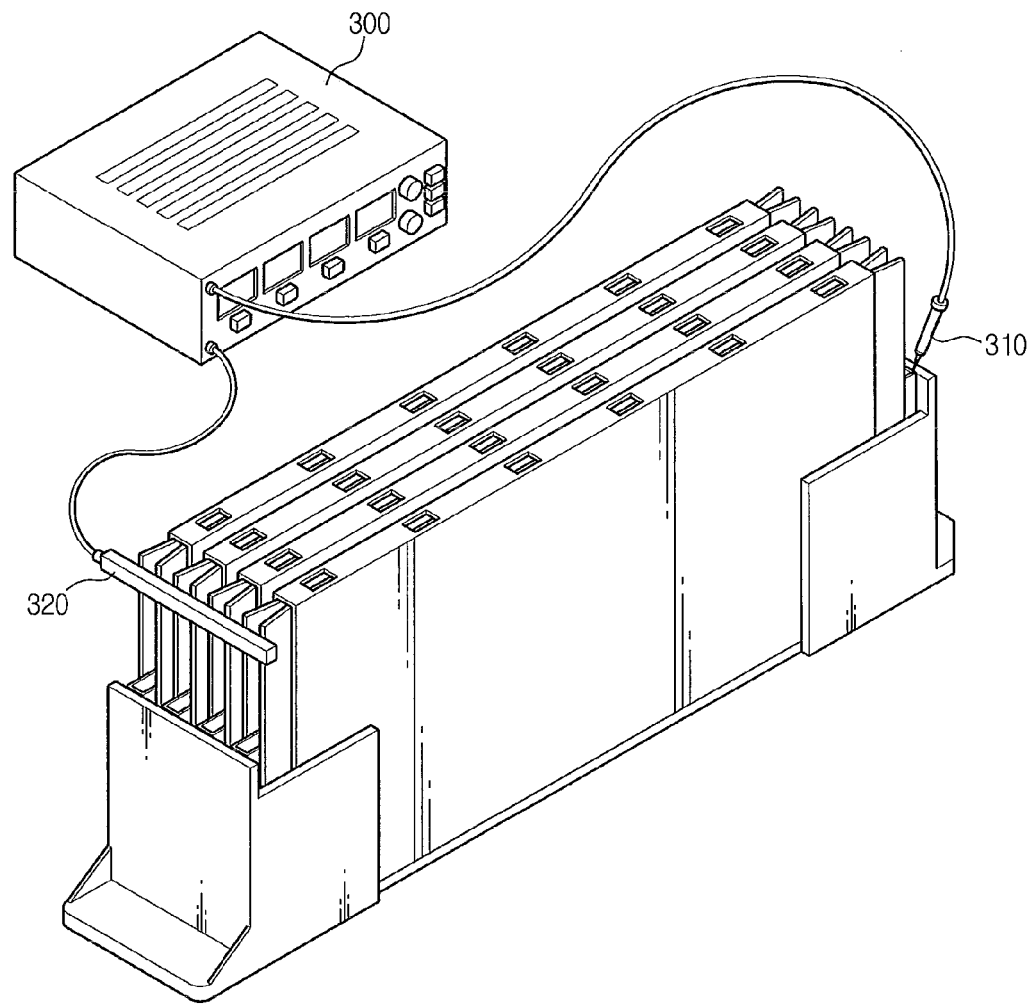
FIG. 8 is a perspective view showing one embodiment of the method for checking insulation of a cell module assembly according to the present invention.

Along with it, a second probing unit 320 is electrically contacted to sides, namely connected to aluminum films, of pouches 120 of selected cells among the plurality of pouch cells 100 as shown in FIG. 8. All of the pouch cells 100 may be contacted with the second probing unit 320, or various number of pouch cells equal to or greater than two may be selected depending on a subject to be measured.

As mentioned above, in order to check overall and integrated insulation of the cell module assembly 200, the second probing unit 320 is preferably contacted to all pouch cells 100 of the cell module assembly 200 to measure an insulation resistance of the cell module assembly 200.

Though it is illustrated and explained in drawings and following description that the cell module assembly (CMA)

200 is composed of eight battery cells, it is just one example, and the cell module assembly may be composed of various numbers of battery cells.

The second probing unit 320 is made of conductive material extending in a length direction thereof as shown in FIG. 8, and it may be modified in various ways regardless of its shape if it can be contacted to all pouches of the plurality of pouch cells 100. The first probing unit 310 and the second probing unit 320 are electrically contacted to a predetermined measuring device or a checking device 300.

As explained above, the pouch 120 of the pouch cell 100 has a weak physical supporting force, differently from other kinds of cells, so the second probing unit 320 is preferably made of conductive elastic material. Various kinds of materials having conductivity and elasticity may be used for the pouch 120, and conductive silicon rubber having high conductivity and high flexibility is preferred as the conductive elastic material.

Since the second probing unit 320, particularly its portion contacted with the aluminum film, is made of conductive elastic material as mentioned above, an external physical pressure applied to the pouch aluminum film may be primarily lessened or dispersed to minimize damage on the appearance of the aluminum film of the pouch and further improve its electric contact, thereby eventually promoting stable operation of the cell module assembly 200.

Figure 1:
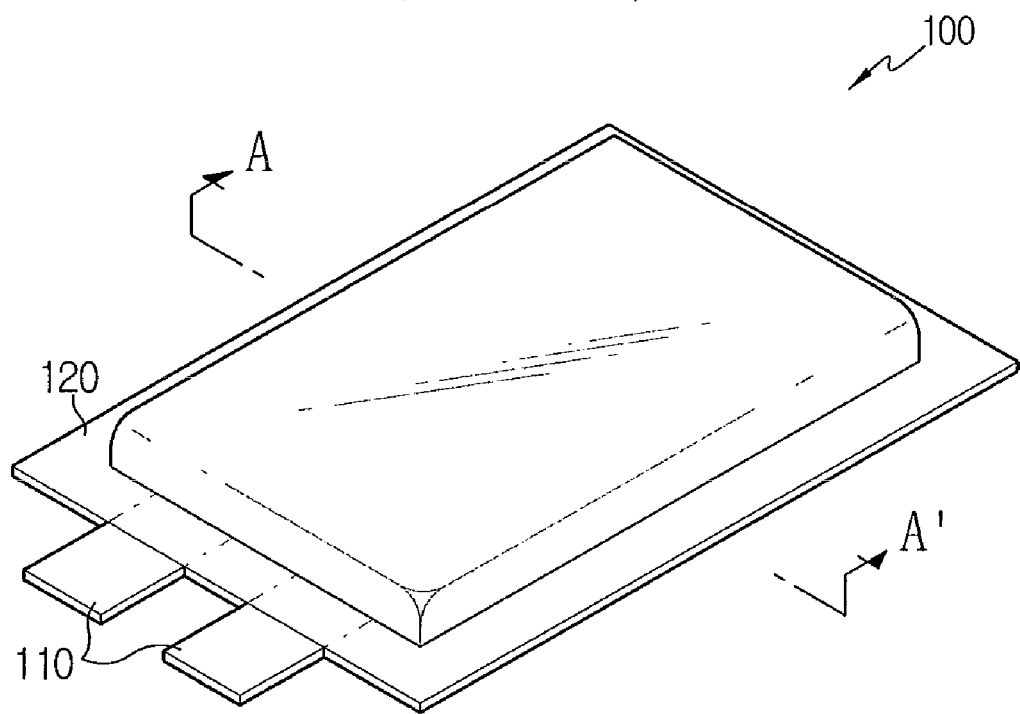
FIG. 1 is a perspective view showing an appearance of a pouch cell.
Figure 2:
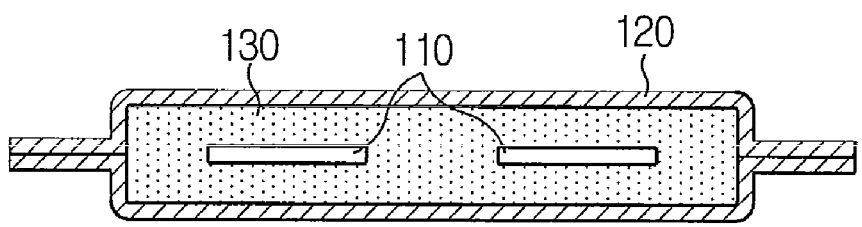
FIG. 2 is a sectional view taken along the line A-A' of FIG. 1.
Figure 3:
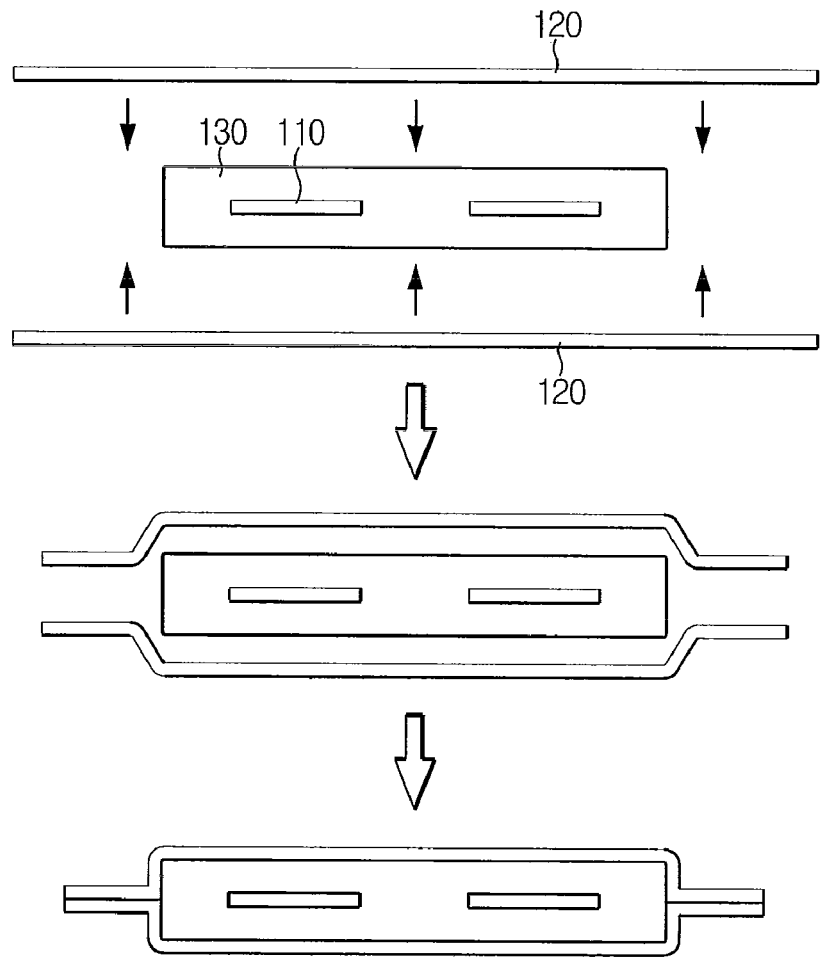
FIG. 3 is a schematic view illustrating how the pouch cell is configured.
Figure 4:
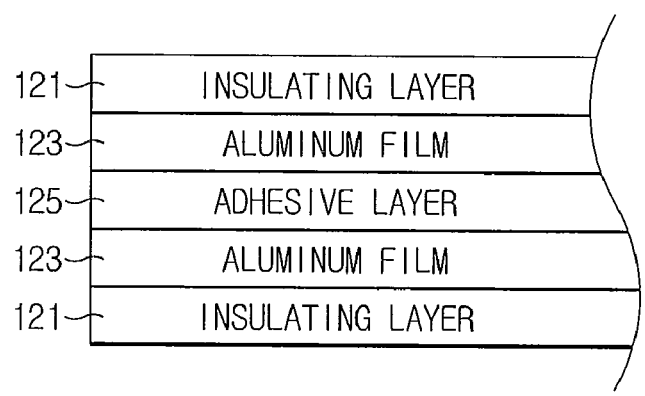
FIG. 4 is a sectional view showing an outer periphery of the pouch cell.
Figure 5:
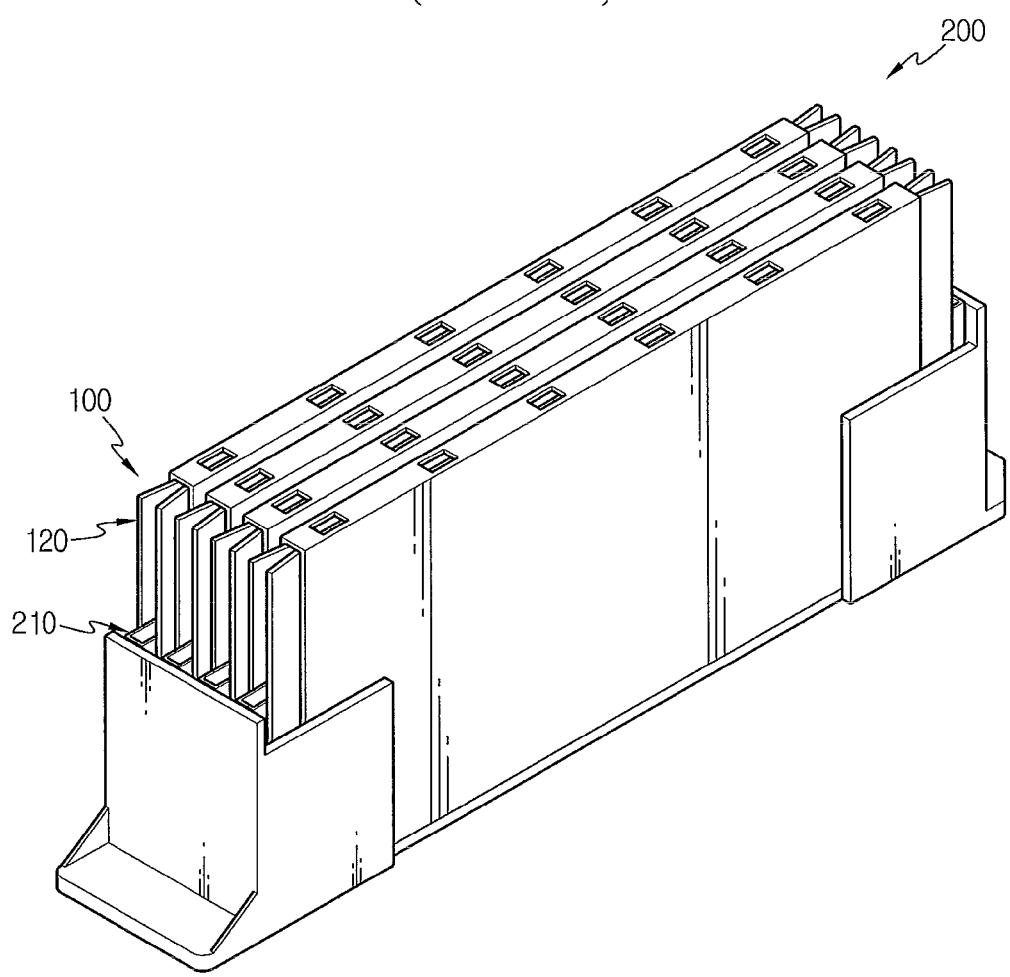
FIG. 5 is a perspective view showing an appearance of a cell module assembly composed of a plurality of pouch cells.
Figure 6:
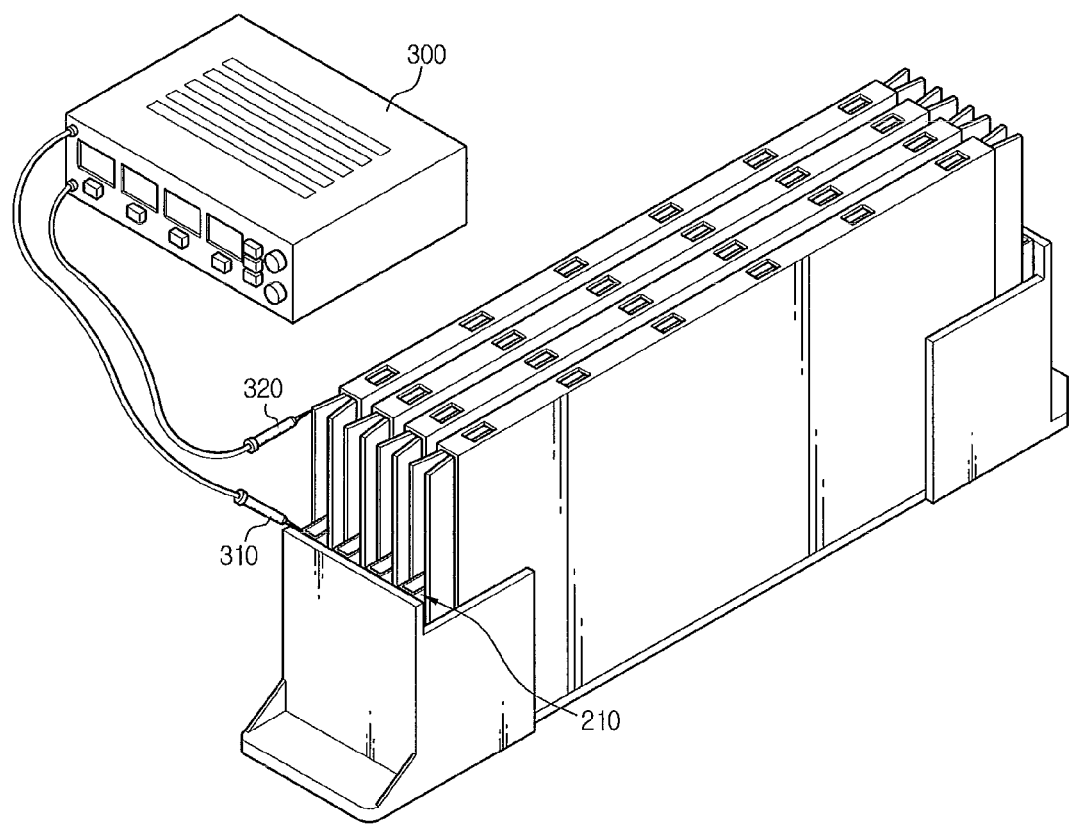
FIG. 6 is a perspective view illustrating how to determine insulation of a cell module assembly in a conventional case.
Figure 7:
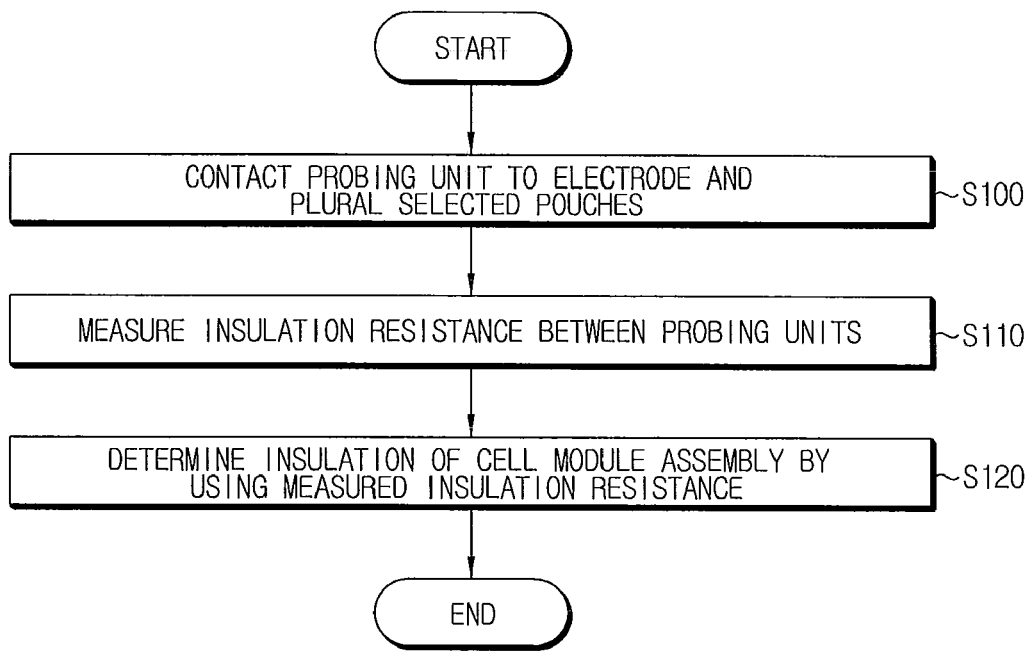
FIG. 7 is a flowchart illustrating a method for checking insulation of a cell module assembly according to the present invention.

If the probing units 310, 320 are contacted with the electrode of the cell module assembly 200 and the selected pouches (S100, see FIG. 7), the measuring means of the present invention measures an insulation resistance between the first probing unit 310 and the second probing unit 320 (S110, see FIG. 7). The measuring means may be the checking device 300 as shown in FIG. 8, or the measuring means may be one module included in the checking device 300.

A determining means, which may be added in some embodiments, compares the measured insulation resistance between the first and second probing units with a reference value to determine insulation of the battery cell (S120, see FIG. 7).

The determining means may be configured as a logic circuit executing the above function, and it may be configured as one module in the checking device as shown in FIG. 8, as being apparent to those having ordinary skill in the art.

The checking device including the measuring means and the determining means of the present invention will be explained later in detail.

Meanwhile, in order to enhance contact and contact persistence between the second probing unit 320 and the aluminum film of the pouch 120, the second probing unit 320 to be contacted with the aluminum film of the pouch 120 preferably has a plurality of grooves 321 into which a plurality of the selected pouch aluminum films are contacted by fitting.

Since the aluminum film of the pouch 120 is fitted into and contacted with the groove 321, a physical supporting force may be ensured due to the outer wall of the groove, thereby ensuring more stable electric contact.

Figure 9:
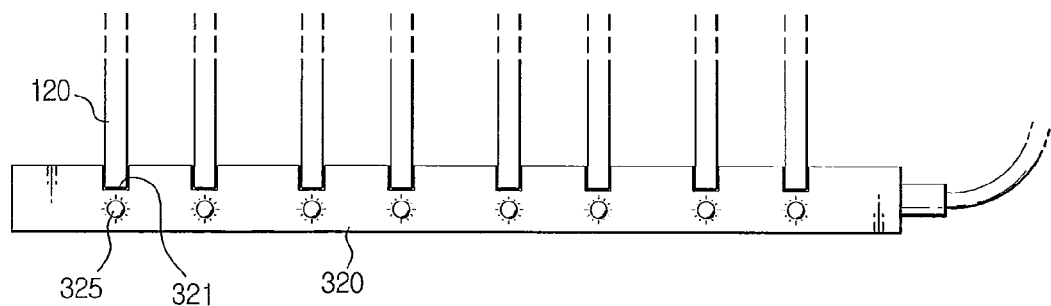
FIG. 9 is a schematic view showing one embodiment of a probe employed in an apparatus for checking insulation of a cell module assembly according to the present invention.

Also, in order to improve convenience in use and reliability in measurement, the second probing unit 320 preferably includes at least one visual display 325 such as LED or electrochromic device such that a user may visually recognize that the pouch 120 is electrically contacted with the second probing unit 320 or the groove 321 of the second probing unit 320, as shown in FIG. 9.

The cell module assembly 200 may be configured in various shapes depending on actual equipment loaded thereon or surrounding environments, so the number of the grooves 321 explained above may also be selected variously, and gaps among the grooves 321 may also be adjusted, preferably.

Figure 10:
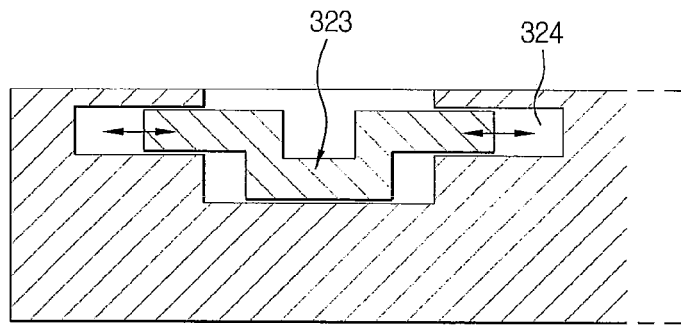
FIG. 10 is a schematic view showing another embodiment of the probe employed in the apparatus for checking insulation of a cell module assembly according to the present invention.

In other words, the groove 321 may include a guide 324 for guiding a sliding movement and a sliding unit 323 laterally movable along a guide surface of the guide 324, as shown in FIG. 10. At this time, the electric contact between the sliding unit 323 and the second probing unit 320 should be maintained.

Hereinafter, the checking device 300 of the present invention is explained in detail with reference to FIG. 11.

Figure 11:
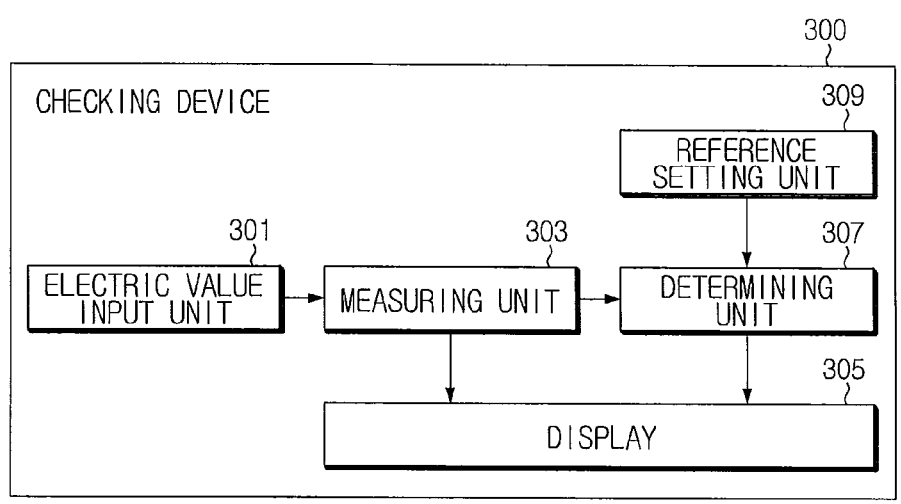
FIG. 11 is a block diagram showing an apparatus for checking insulation according to a preferred embodiment of the present invention.

As shown in FIG. 11, the insulation checking device 300 of the cell module assembly 200 according to the present invention may include an electric value input unit 301, a measuring unit 303, a display 305, a determining unit 307 and a reference setting unit 309.

The electric value input unit 301 is a module electrically contacted to the first and second probing units 310, 320, explained above, and the electric value input unit 301 is also connected to the measuring unit 303 of the present invention.

The measuring unit 303 measures an electric characteristic value such as an insulation resistance from the first and second probing units 310, 320 via the electric value input unit 301. The measuring unit 303 is configured to output the measured insulation resistance to the display 305 such that a user or a manager may visually check it.

In addition, the insulation resistance measured in the measuring unit 303 is input to the determining unit 307 of the present invention, and the determining unit 307 reads a reference value for checking insulation of the cell module assembly 200 from the reference setting unit 309 and determines insulation by comparing the insulation resistance input from the measuring unit with the reference value. The determination result may be output to the display 305 and interfaced such that a user may visually recognize it.

The reference setting unit 309 may store database for the reference value in an internal memory, and the reference setting unit 309 may be configured to have a user interface means so as to receive, change or set a reference value according to specification of a checking subject, the number of battery cells or checking environments by a user.

Hereinafter, the reference value for determining insulation of a plurality of selected battery cells according to the present invention is explained with reference to FIG. 12.

As shown in FIG. 12, on the assumption that the cell module assembly 200 is composed of eight individual pouch cells 100, if insulation references of the individual pouch cells are represented as R1, R2, . . . , R8 in order, the insulation reference may be expressed as in the following equation 1 since the resistance Rt measured by the probing unit has a resistance value r such as a resistance in itself or a contact resistance.

$$R_t = r + \frac{1}{\left(\frac{1}{R_1} + \frac{1}{R_2} + \frac{1}{R_3} + \frac{1}{R_4} + \frac{1}{R_5} + \frac{1}{R_6} + \frac{1}{R_7} + \frac{1}{R_8}\right)} \quad \text{Equation 1}$$

In an ideal case, the insulation resistance of each cell is corresponding to a very large value approximating to infinity, and the r value is relatively very small in comparison to the R value. Assuming that resistances of individual pouch cells 100 are equal within an allowable range for the convenience of explanation, the equation 1 may be expressed as follows.

$$R_t = \frac{1}{\left(\frac{1}{R} + \frac{1}{R} + \frac{1}{R} + \frac{1}{R} + \frac{1}{R} + \frac{1}{R} + \frac{1}{R} + \frac{1}{R}\right)} = \frac{R}{8} \quad \text{Equation 2}$$

Assuming that a reference resistance for the insulation resistance of the battery cell is a, it may be determined that the battery cell maintains its insulation in case the actually measured insulation resistance of the battery cell is greater than the a value.

Since a plurality of battery cells are connected in parallel as shown in FIG. 12, the value Rrt serving as a reference for insulation determination of the cell module assembly in which eight battery cells are integrated may be Ra/8 if an insulation resistance serving as the reference of individual battery cells is Ra. Thus, if the actually measured insulation resistance Rt is greater than Ra/8, the cell module assembly may be determined to maintain insulation.

Meanwhile, though the insulation of an individual battery cell is damaged, or though an insulation resistance of an individual battery cell is smaller than the reference insulation resistance required for the individual battery cell, the damage may be overlooked since the plurality of battery cells are connected in parallel and the insulation resistance is calculated using the mathematical equations at measuring the insulation resistance of the entire cell module assembly.

While a plurality of resistances connected in parallel are measured as mentioned above, it is preferred to set the reference value to eliminate any possibility of the above case so as to fundamentally prevent inferior insulation of individual battery cells.

The followings are more supplementary explanations based on concrete examples. First, if an insulation resistance reference value for determining insulation of individual battery cells is 100 MΩ, an insulation resistance actually measured through experiments is commonly very greater than 100 MΩ. However, a battery cell whose insulation resistance is determined as being destroyed exhibits a resistance smaller than 100 MΩ.

If the reference resistance for determining insulation of each battery cell is 100 MΩ as mentioned above, in case two battery cells are connected in parallel, a reference resistance for determining insulation of the cell module assembly becomes 50 MΩ. The reference value may be set as 50 MΩ in common cases, but if actually measured insulation resistances are respectively R1=400MΩ and R2=80 MΩ, a measured insulation resistance Rt where R1 and R2 are connected in parallel becomes (R1×R2)/(R1+R2)≈67 MΩ.

Seeing the above example, in aspect of parallel-connected resistances, the Rt value is greater than 50 MΩ, so it may be determined as a good product whose insulation is maintained, but in aspect of individual insulation resistances, R2 may be considered as an inferior product whose insulation is broken since its value is 80 MΩ that is smaller than an individual reference resistance 100 MΩ.

The above description may be more clearly understood by applying an electric circuit theory that the total resistance value of a plurality of resistors connected in parallel cannot be greater than an individual resistance due to electric characteristics.

The present invention is directed to checking insulation in an easier and more accurate way. Thus, the insulation checking may be performed more quickly if cell module assembles not passing the primary checking process in terms of cell module assemblies are selected and then the insulation checking in terms of individual battery cells is performed only for individual battery cells included in the selected cell module assembles.

TABLE 1

| | Insulation at checking | | | |
|---|---|---|---|---|
| | Normal (good) | | Abnormal (inferior) | |
| | Insulation at actual cell | | | |
| | normal | abnormal | normal | abnormal |
| # | ① | ② | ③ | ④ |

As seen from the table 1, in the case ①, a cell module assembly was determined as normal in the insulation checking in terms of cell module assemblies, and thus actual individual battery cells were also considered as normal, and the case ④ was an entirely contrary case. Here, in the case ③ at which a cell module assembly was determined having an inferior insulation and thus actual individual cells were additionally checked and then determined as good, there was no problem except that additional checking should be performed for individual cells.

However, in the case ②, the insulation checking in terms of cell module assembly was determined as normal, but the cell module assembly substantially had an inferior battery cell, so there may issue a problem since an actually inferior battery cell could not be selected. Thus, it is required to set a reference value such that the case does not occur.

If just an arithmetic mathematical operation at a parallel circuit is applied to calculate an insulation resistance reference value Rrt of the cell module assembly as in the above example, in case two battery cells are connected in the cell module assembly, an insulation resistance reference value Ra of individual cell is 100 MΩ, so the calculated insulation resistance reference value Rrte becomes 50 MΩ. In case four battery cells are connected in the cell module assembly, the insulation resistance reference value Rrte would be 25 MΩ.

However, if the reference value Rrt for the insulation checking of a cell module assembly is set as the above Rrte, the case ② may not be distinguished. Thus, it is required to select the Rte as the reference value Ra of individual battery cell in the above consideration.

In the above case, in case a cell module assembly is composed of two battery cells (Ra=100 MΩ), Rrt would be 50 MΩ if Rrt is set as Rrte. However, assuming that resistances R1 and R2 of each battery cell are respectively 400 MΩ and 80 MΩ, the insulation resistance Rt for the checking becomes 67 MΩ, which is determined as good since it is greater than 50 MΩ (Rrte).

In other words, though the insulation of an individual battery cell is actually destroyed, the cell module assembly is checked as good, which is corresponding to the case ②. However, if Rrt is set as 100 MΩ (Rrte) that is the insulation resistance reference value of individual battery cells, the insulation resistance 67 MΩ at the checking is smaller than 100 MΩ, so the case ② may be distinguished at the checking process in terms of cell module assemblies.

Actually, if the insulation resistor is broken, the resistance is lowered to a very small value, so the case ② hardly happens. Thus, the Rrt may be set as Rrte. However, for more precise checking, it is preferred to set Rrt as Ra.

Based on the principle of an electric circuit that the entire resistance of battery cells connected in parallel is never greater than a resistance of an individual battery cell as explained above, since the individual insulation resistance reference values Ra of the battery cells are commonly identical, the reference value Rrt is set identically to the reference value for the insulation determination of a single pouch cell. Also, if insulation resistance reference values Ra of individual battery cells are not identical to each other, the smallest value among them is preferably set as the reference value Rrt.

The method for checking insulation of a cell module assembly, proposed in the present invention, may give as good efficiency as being proportional to the maximum number of individual battery cells in comparison to a method for checking insulation of individual battery cells one by one.

In the present invention, each component of the checking device should be understood as a logic component rather than a physically distinguishable component. In other words, each component corresponds to a component logically distinguished to implement the technical spirit of the present invention. Thus, though the component are integrated with another component or divided into several subordinate components when being executed, such integrated or divided component should also be considered as being included in the scope of the present invention if it can execute the function of the logic configuration of the present invention.

In addition, the method for checking insulation of a cell module assembly according to the present invention may be implemented as computer-readable codes in a computer-readable recording medium. The computer-readable recording medium can be all kinds of recording devices in which computer-readable data may be stored. The computer-readable recording medium may be ROM, RAM, CD-ROM, magnetic tape, floppy disk, optical data storage and so on, and any device operated by means of carrier waves (for example, transmission via Internet) are also included therein. In addition, the computer-readable recording medium may be distributed in computer devices connected by a network such that computer-readable codes are stored and executed in a distributive manner. Also, functional programs, codes and code segments for implementing the method for checking insulation of a cell module assembly may be easily inferred by programmers in the related art.

The present invention has been described in detail. However, it should be understood that the detailed description and specific examples, while indicating preferred embodiments of the invention, are given by way of illustration only, since various changes and modifications within the spirit and scope of the invention will become apparent to those skilled in the art from this detailed description.

What is claimed is:

1. An apparatus for checking insulation of a cell module assembly composed of a plurality of pouch cells, the apparatus comprising:
    a first probing means electrically contacted to an electrode of the cell module assembly;
    a second probing means electrically contacted to aluminum films of a plurality of selected pouch cells in the cell module assembly; and
    a measuring means for measuring an insulation resistance between the first probing means and the second probing means.

2. The apparatus for checking insulation of a cell module assembly according to claim 1, further comprising a determining means for determining insulation of the pouch cells by comparing a measured insulation resistance with a reference value.

3. The apparatus for checking insulation of a cell module assembly according to claim 1, wherein the second probing means comprises a conductive elastic material.

4. The apparatus for checking insulation of a cell module assembly according to claim 3, wherein the conductive elastic material is a conductive silicon rubber.

5. The apparatus for checking insulation of a cell module assembly according to claim 1, wherein the second probing means comprises at least one groove, and
    wherein the aluminum films of the plurality of selected pouch cells are contacted to the at least one groove.

6. The apparatus for checking insulation of a cell module assembly according to claim 5, wherein the at least one groove comprises:
    a guide for guiding a sliding movement; and
    a sliding unit laterally movable along the guide.

7. The apparatus for checking insulation of a cell module assembly according to claim 2, wherein the reference value is set identically to a reference value for determining insulation of a single pouch cell.

8. The apparatus for checking insulation of a cell module assembly according to claim 2, wherein, when reference values for determining insulation of the plurality of selected pouch cells are not identical to each other, the reference value is set as a smallest value of the reference values.

9. A method for checking insulation of a cell module assembly composed of a plurality of pouch cells, the method comprising:
    a first contacting step for electrically contacting a first probing means to an electrode of the cell module assembly;
    a second contacting step for electrically contacting a second probing means to aluminum films of a plurality of selected pouch cells in the cell module assembly; and
    a measuring step for measuring an insulation resistance between the first probing means and the second probing means.

10. The method for checking insulation of a cell module assembly according to claim 9, further comprising a determining step for determining insulation of the battery cell by comparing the measured insulation resistance with a reference value.

11. The method for checking insulation of a cell module assembly according to claim 9, wherein the second probing means is made of comprises a conductive elastic material.

12. The method for checking insulation of a cell module assembly according to claim 11, wherein the conductive elastic material is a conductive silicon rubber.

13. The method for checking insulation of a cell module assembly according to claim 9, wherein the second probing means has comprises at least one groove, and
    wherein the aluminum films of the plurality of selected pouch cells are contacted to the at least one groove.

14. The method for checking insulation of a cell module assembly according to claim 13, wherein the at least one groove comprises:
    a guide for guiding a sliding movement; and
    a sliding unit laterally movable along the guide.

15. The method for checking insulation of a cell module assembly according to claim 10, wherein the reference value is set identically to a reference value for determining insulation of a single pouch cell.

16. The method for checking insulation of a cell module assembly according to claim 10, wherein, when reference values for determining insulation of the plurality of selected pouch cells are not identical to each other, the reference value is set as a smallest value of the reference values.

17. A probe for checking insulation of a cell module assembly by measuring an insulation resistance between an electrode of a cell module assembly composed of a plurality of pouch cells and aluminum films of a plurality of selected pouch cells in the cell module assembly, the probe comprising:

a contact portion electrically contacted to all aluminum films of the plurality of selected pouch cells.

18. The probe for checking insulation of a cell module assembly according to claim 17, wherein the contact portion comprises a conductive elastic material.

19. The probe for checking insulation of a cell module assembly according to claim 18, wherein the conductive elastic material is a conductive silicon rubber.

20. The probe for checking insulation of a cell module assembly according to claim 17, wherein the contact portion comprises at least one groove, and wherein the aluminum films of the plurality of selected pouch cells are contacted to the at least one groove.

21. The probe for checking insulation of a cell module assembly according to claim 20, wherein the at least one groove comprises:

a guide for guiding a sliding movement; and a sliding unit laterally movable along the guide.

22. A non-transitory computer-readable recording medium containing computer instructions stored therein for causing a computer processor to perform a method to check insulation of a cell module assembly composed of a plurality of pouch cells, the method including:

a first contacting step for electrically contacting a first probing means to an electrode of the cell module assembly;

a second contacting step for electrically contacting a second probing means to aluminum films of a plurality of selected pouch cells in the cell module assembly;

a measuring step for measuring an insulation resistance between the first probing means and the second probing means; and a determining step for determining insulation of the battery cell by comparing the measured insulation resistance with a reference value.

* * * * *